United States Patent
Kravchenko et al.

(10) Patent No.: US 7,944,327 B2
(45) Date of Patent: May 17, 2011

(54) BAND-PASS FILTER HAVING A RING RESONATOR

(75) Inventors: Roman Kravchenko, Graz (AT); Denys Orlenko, Munich (DE); Georgiy Sevskiy, Munich (DE); Patric Heide, Vaterstetten (DE)

(73) Assignee: Epcos AG, Munich (DE)

( * ) Notice: Subject to any disclaimer, the term of this patent is extended or adjusted under 35 U.S.C. 154(b) by 415 days.

(21) Appl. No.: 12/088,311

(22) PCT Filed: Sep. 26, 2006

(86) PCT No.: PCT/DE2006/001695
§ 371 (c)(1),
(2), (4) Date: Jul. 10, 2008

(87) PCT Pub. No.: WO2007/036211
PCT Pub. Date: Apr. 5, 2007

(65) Prior Publication Data
US 2009/0027139 A1    Jan. 29, 2009

(30) Foreign Application Priority Data
Sep. 28, 2005  (DE) .......................... 10 2005 046 445

(51) Int. Cl.
*H03H 7/01* (2006.01)
*H01P 1/20* (2006.01)
(52) U.S. Cl. ........................................ 333/185; 333/204
(58) Field of Classification Search ............... 333/167, 333/175, 185, 204, 205
See application file for complete search history.

(56) References Cited

U.S. PATENT DOCUMENTS
4,035,628 A    7/1977 Lampe et al.
(Continued)

FOREIGN PATENT DOCUMENTS
DE    3304776    8/1984
(Continued)

OTHER PUBLICATIONS

Albert B. et al "Novel Design Approach for Transversal Notch Filter using Recursive Principles" IEEE MTT-S Digest, 2004.

(Continued)

*Primary Examiner* — Robert Pascal
*Assistant Examiner* — Kimberly E Glenn
(74) *Attorney, Agent, or Firm* — Fish & Richardson P.C.

(57) ABSTRACT

A bandpass filter is described herein. The bandpass filter has two parallel signal branches, each connected, on an input side, to an input node and, on an output side, to an output node. The two signal branches form a ring resonator, having a wave mode with a complex amplitude of $\vec{U}_{CW}=|\vec{U}_{CW}|\exp\{-j\phi_{CW}\}$ propagating in a clockwise direction and a wave mode with a complex amplitude of $\vec{U}_{CCW}=|\vec{U}_{CCW}|\exp\{-j\phi_{CCW}\}$ propagating in a counterclockwise direction. The vector sum of a resulting wave $\vec{U}_{out}$ at the output node of the bandpass filter at two or more stop frequencies is: $\vec{U}_{out}=\vec{U}_{CW}+\vec{U}_{CCW}=0$, and $|\vec{U}_{CW}|=|\vec{U}_{CCW}|$ and $|\phi_{CW}-\phi_{CCW}|=180°$. The stop frequencies are arranged such that a passband is formed between two stop frequencies.

20 Claims, 4 Drawing Sheets

U.S. PATENT DOCUMENTS

| | | | |
|---|---|---|---|
| 4,398,163 A | 8/1983 | Feldmann et al. | |
| 4,661,789 A | 4/1987 | Rauscher | |
| 4,724,407 A | 2/1988 | Miura et al. | |
| 5,021,756 A | 6/1991 | Tajima et al. | |
| 5,191,305 A | 3/1993 | Frost et al. | |
| 5,301,135 A | 4/1994 | Principe et al. | |
| 5,339,057 A | 8/1994 | Rauscher | |
| 5,745,838 A * | 4/1998 | Tresness et al. | 725/128 |
| 5,883,553 A | 3/1999 | Tsumura | |
| 5,926,455 A | 7/1999 | Allpress | |
| 6,219,683 B1 | 4/2001 | Guzik et al. | |
| 6,323,743 B1 * | 11/2001 | Zelenz et al. | 333/185 |
| 6,737,935 B1 * | 5/2004 | Shafer | 333/132 |
| 6,784,760 B2 * | 8/2004 | Olcen et al. | 333/176 |
| 6,842,086 B1 * | 1/2005 | Zennamo, Jr. | 333/175 |

FOREIGN PATENT DOCUMENTS

| | | |
|---|---|---|
| JP | 56-032814 | 4/1981 |
| WO | WO94/07212 | 3/1994 |

OTHER PUBLICATIONS

Billonnet L. et al. "Design Concept for Microwave Recursive and Transversal Filters Using Lange Couplers" IEEE MTT-S Digest, 1992.

Mouzannar W. et al. "A New Design Concept for Realising Highly Tunable Microwave Filters using Recursive Principles" IEEE 28. European Microwave Conference, Amsterdam, 1998.

Mouzannar W. et al. "A New Design Concept for Wideband Frequency-Tunable and High Order MMIC Microwave Active Recursive Filters" Microwave and Optical Technology Letters, vol. 24, No. 6, Mar. 2000.

International Search Report for PCT/DE2006/001695.

Written Opinion for PCT/DE2006/001695.

English translation of Written Opinion for PCT/DE2006/001695.

\* cited by examiner

BAND-PASS FILTER HAVING A RING RESONATOR

CROSS REFERENCE TO RELATED APPLICATIONS

Pursuant to 35 USC §120, this application claims the benefit of PCT/DE2006/001695 filed Sep. 26, 2006 which claims the benefit of German Patent Application No. 102005046445.9 filed Sep. 28, 2005. Each of these applications is incorporated by reference in its entirety.

TECHNICAL FIELD

A bandpass filter that can be inserted, e.g., into a front-end circuit, will be specified.

BACKGROUND

A bandpass filter is known from publication U.S. Pat. No. 5,191,305. A filter with delay lines is known from publication U.S. Pat. No. 5,301,135. Transversal and recursive filters are known from publication U.S. Pat. No. 5,021,756.

SUMMARY

A task to be achieved is to specify a bandpass filter with low insertion loss and high insertion loss for interference signals in stop bands.

The bandpass filter is suitable for integration in a substrate, especially an LTCC substrate, in which a front-end module is realized. The front-end module can be designed as a multi-band module. The front-end module can be designed, e.g., as a WLAN module with two frequency bands 2.4 . . . 2.5 GHz and 4.9 . . . 5.95 GHz.

The transfer function of the specified bandpass filter has steep flanks.

A bandpass filter will be specified with signal branches that are connected in parallel and are joined on the input side and on the output side into a common signal path. Two signal branches form a ring resonator, in which a wave mode with a complex amplitude $\vec{U}_{CW}=|\vec{U}_{CW}|\exp\{-j\phi_{CW}\}$ running in the clockwise direction and a wave mode with a complex amplitude $\vec{U}_{CCW}=|\vec{U}_{CCW}|\exp\{-j\phi_{CCW}\}$ running in the counterclockwise direction can propagate. For the resulting wave $\vec{U}_{out}$ at the output of the bandpass filter, for at least two stop frequencies, the condition $\vec{U}_{out}=\vec{U}_{CW}+\vec{U}_{CCW}\approx 0$ applies, wherein the amplitudes of opposed wave modes are approximately equal $|\vec{U}_{CW}|\approx|\vec{U}_{CCW}|$, and wherein the phase difference of these wave modes equals 180°: $|\phi_{CW}-\phi_{CCW}|=180°$.

The transmission coefficient of each signal branch is equal in both passage directions, so that the two opposed wave modes can circulate. The signal branches feature a frequency-dependent runtime, and each acts as a phase shifter. Two different signal branches preferably feature amplitude characteristic lines and/or phase characteristic lines that are different from each other.

In an advantageous variant, the ring resonator includes concentrated LC elements, i.e., capacitors, inductors. In principle, an inductor can be replaced by a section of a delay or transmission line.

The ring resonator, however, can also be formed exclusively from line sections. The line sections arranged in the first and/or second signal branch can feature an impedance jump. This can be realized, e.g., by a stub at a suitable position of the line section.

The fed electromagnetic wave is divided at the input node of the first and the second signal branch into an incoming wave component running in the clockwise direction and an incoming wave component running in the counterclockwise direction. The incoming wave component led into the first (or second) branch is reflected partially back into this signal branch at the output node, at which the signal branches are joined together again. The wave mode running in the clockwise direction represents the sum of all incoming and reflected wave components rotating to the right. The wave mode running in the counterclockwise direction represents the sum of all incoming and reflected wave components rotating to the left.

In one variant, in the first signal branch there is an LCL component made from two series inductors and a capacitor connected to ground. In the second signal branch, there is a CLC component made from two series capacitors and an inductor connected to ground.

In one variant, both capacitive and also inductive elements are arranged in the series branch of the first and the second signal branch. Here, the direct-current component of the input signal can be suppressed.

In one advantageous variant, in the first signal branch there is a first T connection made from two series inductors and a capacitor connected to ground and a second T-connection connected to the output of the first T-connection and made from two series capacitors and an inductor connected to ground. Here, a first T-connection made from two series capacitors and an inductor connected to ground and a second T connection connected to the output of the first T-connection and made from two series inductors and a capacitor connected to ground are arranged in the second signal branch.

The component of the first signal branch connected to the common signal path on the input side is preferably inductive if the component of the second signal branch connected to the common signal path on the input side is capacitive and vice versa.

The component of the first signal branch connected to the common signal path on the output side is preferably inductive if the component of the second signal branch connected to the common signal path on the output side is capacitive or vice versa.

For the resulting wave $\vec{U}_{out}$ at the output node of the bandpass filter, in one variant, the condition $\vec{U}_{out}=\vec{U}_{CW}+\vec{U}_{CCW}=0$ is fulfilled at three or more stop frequencies, wherein the signals propagating in opposite directions feature approximately the same amplitudes and a phase difference of exactly 180°: $|\vec{U}_{CW}|=|\vec{U}_{CCW}|$ and $|\phi_{CW}-\phi_{CCW}|=180°$.

The amplitude and phase characteristic lines of the signal branches are preferably selected so that the stop frequencies are arranged on both sides of the passband of the bandpass filter and provide steep flanks in the transmission characteristic line of the filter.

For the resulting wave $\vec{U}_{out}$ at the output node of the bandpass filter, in one variant, the condition $\vec{U}_{out}=\vec{U}_{CW}+\vec{U}_{CCW}\approx 0$ is fulfilled in at least one stop range, wherein the signals propagating in opposite directions propagating in opposite directions have exactly the same amplitudes and a phase difference of approximately 180°: $|\vec{U}_{CW}|\approx|\vec{U}_{CCW}|$ and $|\phi_{CW}-\phi_{CCW}|\approx 180°$.

Preferably, at two or more frequencies from the stop range, the amplitudes of the wave components running in the opposite sense are equal, wherein their phase difference equals 180°: $|\vec{U}_{CW}|=|\vec{U}_{CCW}|$ and $|\phi_{CW}-\phi_{CCW}|=180°$.

A harmonic of the center frequency of the bandpass filter can lie in the stop range or in the vicinity of a stop frequency. This is especially advantageous in the bandpass filters provided for the transmission path.

In the common path of the bandpass filter on the input and/or output side, there can be another circuit, e.g., a balanced-unbalanced transformer or an impedance converter, which each preferably include concentrated elements.

The bandpass filter is preferably realized in one substrate, e.g., an LTCC substrate by means of the conductor paths and the conductive areas, which are constructed in metallization planes of the substrate. Dielectric layers (for LTCC substrate ceramic layers) are arranged between two metallization layers.

DESCRIPTION OF THE DRAWINGS

The bandpass filter will be explained below with reference to schematic figures not to scale. Shown are.

DETAILED DESCRIPTION

Figure 1A:
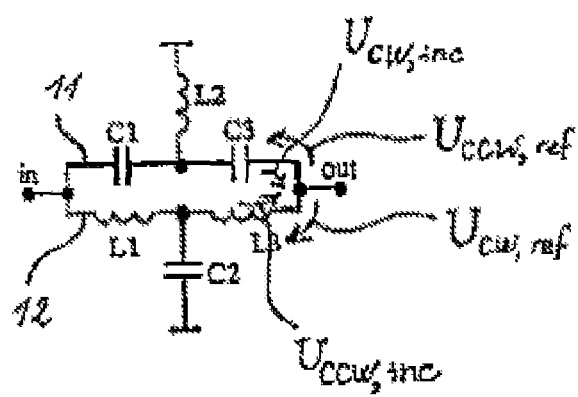
FIG. 1A, a bandpass filter with two T-connections, which has two signal branches connected in parallel, FIG. 1B, the bandpass filter according to FIG. 1A with measurement arrangements arranged in its signal branches.
Figure 1B:
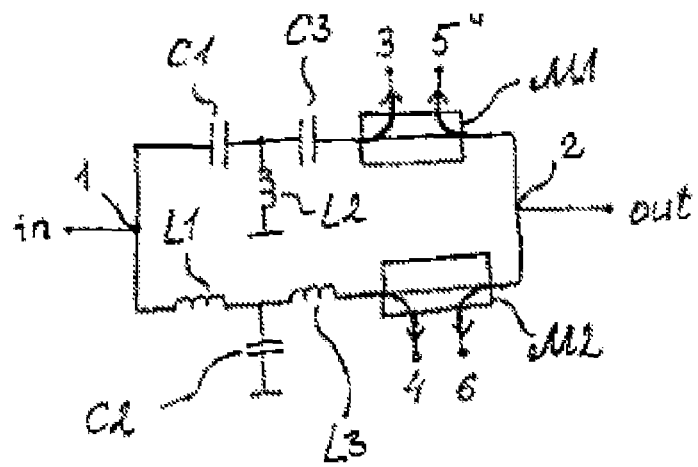

The filter shown in FIG. 1A includes a signal path, which is arranged between a terminal of the input gate IN and a terminal of the output gate OUT of the filter. The signal path includes signal branches 11, 12 (series branches) connected in parallel. Each branch includes a circuit, which here contains only electrically passive components, i.e., capacitors, inductors, and optionally line sections, that is, no semiconductor elements, e.g., amplifier elements. Therefore, each signal branch is reciprocal, i.e., its transmission characteristic is equal in both directions, so that an electromagnetic wave can propagate in the closed loop formed by two branches connected in parallel. This loop is preferably an oscillating circuit or a ring resonator.

The first branch 11 includes a T-connection with two series capacitors C1, C3 and one parallel inductor L2. The second branch 12 includes a T-connection with two series inductors L1, L3 and one parallel capacitor C2. The series capacitors and inductors C1, C3, L1, L3 form a ring resonator, in which an electromagnetic wave can circulate.

For N series branches connected in parallel, the signal applied to the input is divided into N parts, which are joined together again on the output side. Each signal branch represents a delay line for the corresponding sub-signal, wherein $\tau_n$ is the runtime of the signal in the n-th branch and $a_n$ is the transmission coefficient of the n-th branch. The resulting time signal y(t) is calculated as $$y(t) = \sum_{n=1}^{N} a_n x(t-\tau_n).$$

Here t is the time. The corresponding transmission characteristic $S_{21}(f)$ in the frequency range is calculated as $$S_{21}(f) = \sum_{n=1}^{N} A_n \exp(-j2\pi f \tau_n).$$

Here f is the frequency and $A_n$ is the transfer function of the n-th branch.

It is advantageous if the amplitude responses (and/or phase responses) of different series branches of the filter are different from each other. They can be adapted to each other in such a way that a passband in the given frequency range and notches at the given stop frequencies are formed in the transfer function of the total filter.

The incoming electromagnetic wave applied to the input IN is divided at the electrical node 1 into an incoming component $U_{CW,inc}$ running in the clockwise direction and an incoming component $U_{CCW,inc}$ running in the counterclockwise direction.

At the electrical node 2, a part of the component $U_{CW,inc}$ passes into the series branch 12, a part of this component is decoupled into the output path and a part is reflected back into the branch 11, wherein a reflected component $U_{CCW,ref}$ running in the counterclockwise direction is formed. At the electrical node 2, a part of the component $U_{CCW,inc}$ passes into the series branch 11, a part of this component is decoupled into the output path and a part is reflected back into the branch 12, wherein a reflected component $U_{CW,ref}$ running in the clockwise direction is formed.

The sum of all wave components running in the clockwise direction forms a wave mode $U_{CW}$ running in the clockwise direction:

$$\vec{U}_{CW} = \sum_{k} \{(\vec{U}_{CW,inc})_k + (\vec{U}_{CW,ref})_k\}.$$

k is the count of the components of the wave mode.

The sum of all wave components running in the counterclockwise direction forms a wave mode $U_{CCW}$ running in the counterclockwise direction:

$$\vec{U}_{CCW} = \sum_{k} \{(\vec{U}_{CCW,inc})_k + (\vec{U}_{CCW,ref})_k\}.$$

The resulting signal $\vec{U}_{out}=|\vec{U}_{out}|\exp\{-j\phi_{out}\}$ at the output node 2 represents the vector sum of the opposed wave modes at this node: $\vec{U}_{out}=\vec{U}_{CW}+\vec{U}_{CCW}$.

The magnitude of the resulting signal at a given frequency depends on the amplitude and phase relationships of the opposed wave modes $\vec{U}_{CW}$ and $\vec{U}_{CCW}$ at this frequency. A notch, i.e., a break in the transmission characteristic of the filter, is formed, for example, at a frequency at which the vector sum of the opposed wave modes at the output node 2 is equal to zero: $\vec{U}_{CW}+\vec{U}_{CCW}=0$ (destructive interference). This is the case when the two opposed wave modes $\vec{U}_{CW}$ and $\vec{U}_{CCW}$ have the same amplitude $|\vec{U}_{CW}|=|\vec{U}_{CCW}|$ but a phase difference of 180°. The equality of the amplitudes means that the transmission coefficients in the two signal branches are equal at the given stop frequency.

Transmission takes place when the opposed wave modes at the node 2 have different amplitudes from each other, so that their sum is not equal to zero: $\vec{U}_{CW}+\vec{U}_{CCW}\neq 0$. This is the case when the signal branches have different transmission coefficients from each other at the pass frequency.

The complex amplitude of the incoming and reflected waves is measured by means of an ideal measurement arrangement, which has a part M1 arranged in the first signal branch and a part M2 arranged in the second signal branch. The signal passes through this measurement arrangement without loss.

Figure 3:
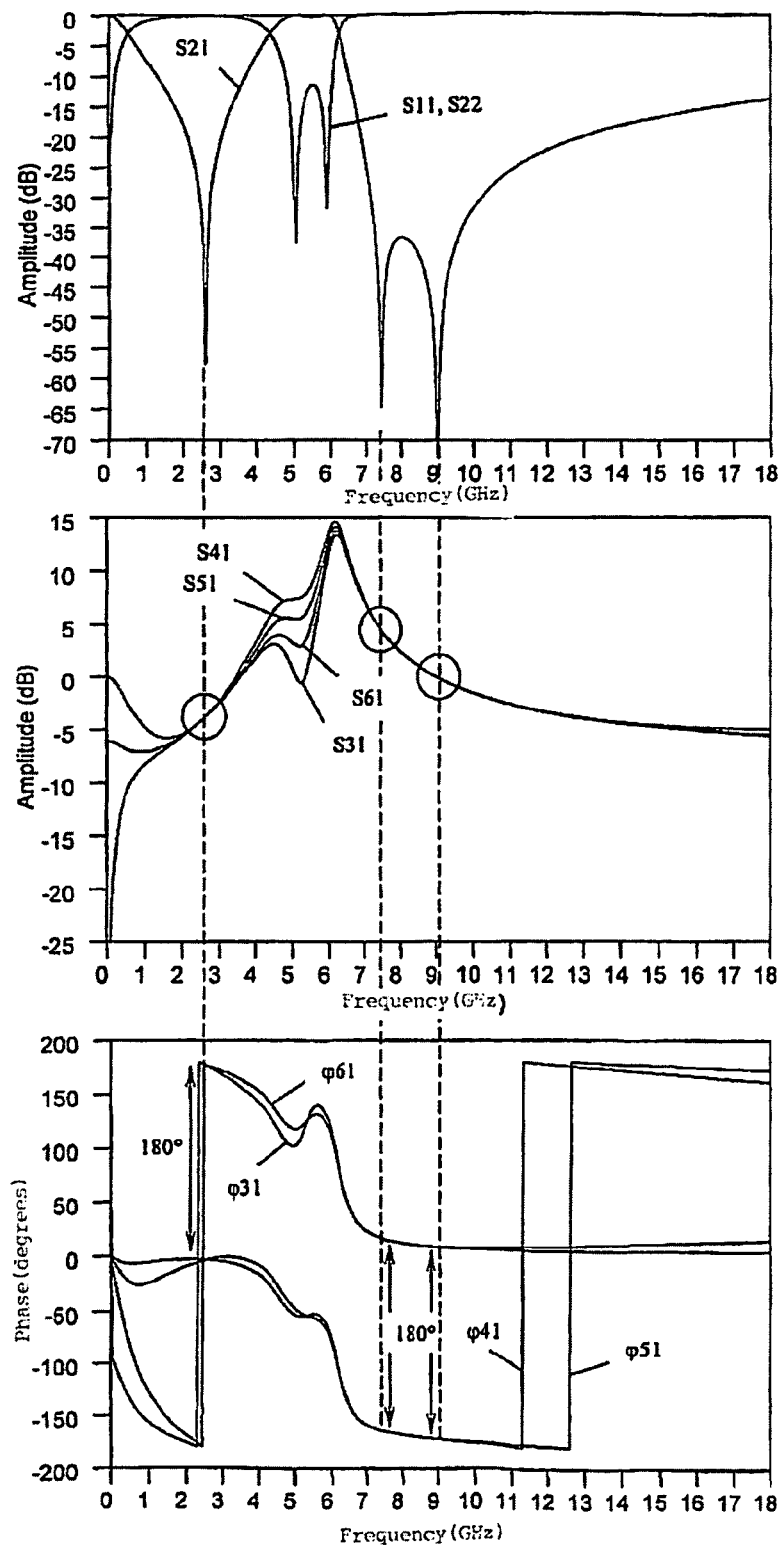
FIG. 3, scattering parameters of the filter according to FIG. 1A at the input and output (top), amplitude response (middle) measured at the ports of the measurement arrangement, phase response (bottom) measured at the ports of the measurement arrangement.

Each part of the measurement arrangement counts the sum of all wave components running in a certain direction—in the clockwise or counterclockwise direction. In FIG. 3, the measurement results are presented in the middle and at the bottom.

Between the nodes 1 and 3, the amplitude response $S_{31}$ and the phase response $\phi_{31}$ of the wave component $U_{CW,inc}$ are detected. Between the nodes 1 and 4, the amplitude response $S_{41}$ and the phase response $\phi_{41}$ of the wave component $U_{CCW,inc}$ are detected. Between the nodes 1 and 5, the amplitude response $S_{51}$ and the phase response $\phi_{51}$ of wave component $U_{CCW,ref}$ reflected at node 2 are detected and between the nodes 1 and 6, the amplitude response $S_{61}$ and the phase response $\phi_{61}$ of the wave component $U_{CW,ref}$ reflected at this node are detected.

The S-matrix of the measurement arrangement is given by $$S[0]=\begin{bmatrix} 0 & 1 & 1 & 0 \\ 1 & 0 & 0 & 1 \\ 1 & 0 & 0 & 0 \\ 0 & 1 & 0 & 0 \end{bmatrix}.$$

Figure 2:
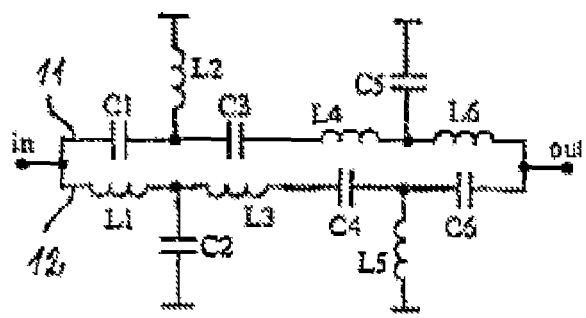
FIG. 2, a bandpass filter with four T-connections, which has two T-connections for each signal branch.

In FIG. 2, a filter with four T-connections is shown. Here, on the input side a CLC element is arranged in the first branch 11, and an LCL element is arranged in the second branch 12. The CLC element arranged in the first branch is formed by the series capacitors C1, C3 and a parallel inductor L2. The LCL element arranged in the second branch is formed by the series inductors L1, L3 and a parallel capacitor C2. On the output side, an LCL element L4, C5, L6 is arranged in the first branch, and a CLC element C4, L5, C6 is arranged in the second branch.

Also like the bandpass filter shown in FIG. 1A, the transmission characteristic of this bandpass filter features three notches. The variant according to FIG. 2 distinguishes itself also in that the direct-current component is suppressed, because series capacitors are arranged in the two series branches connected in parallel.

In one variant, the signal branches can be constructed in such a way that more than three notches are generated in the transmission characteristic of the filter.

At least one of the inductors, e.g., L1-L3 in FIGS. 1A and L1-L6 in FIG. 2, arranged in the signal branches 11, 12 of the filter can have an inductance value of approx. zero.

In FIG. 3 at the top, the transmission characteristic S21 and the reflection coefficient S11 of the filter are shown. The transmission characteristic S21 shows a passband at approx. 5.5 GHz and three notches at approx. 2.6 GHz, 7.45 GHz, and 9 GHz.

Figure 4:
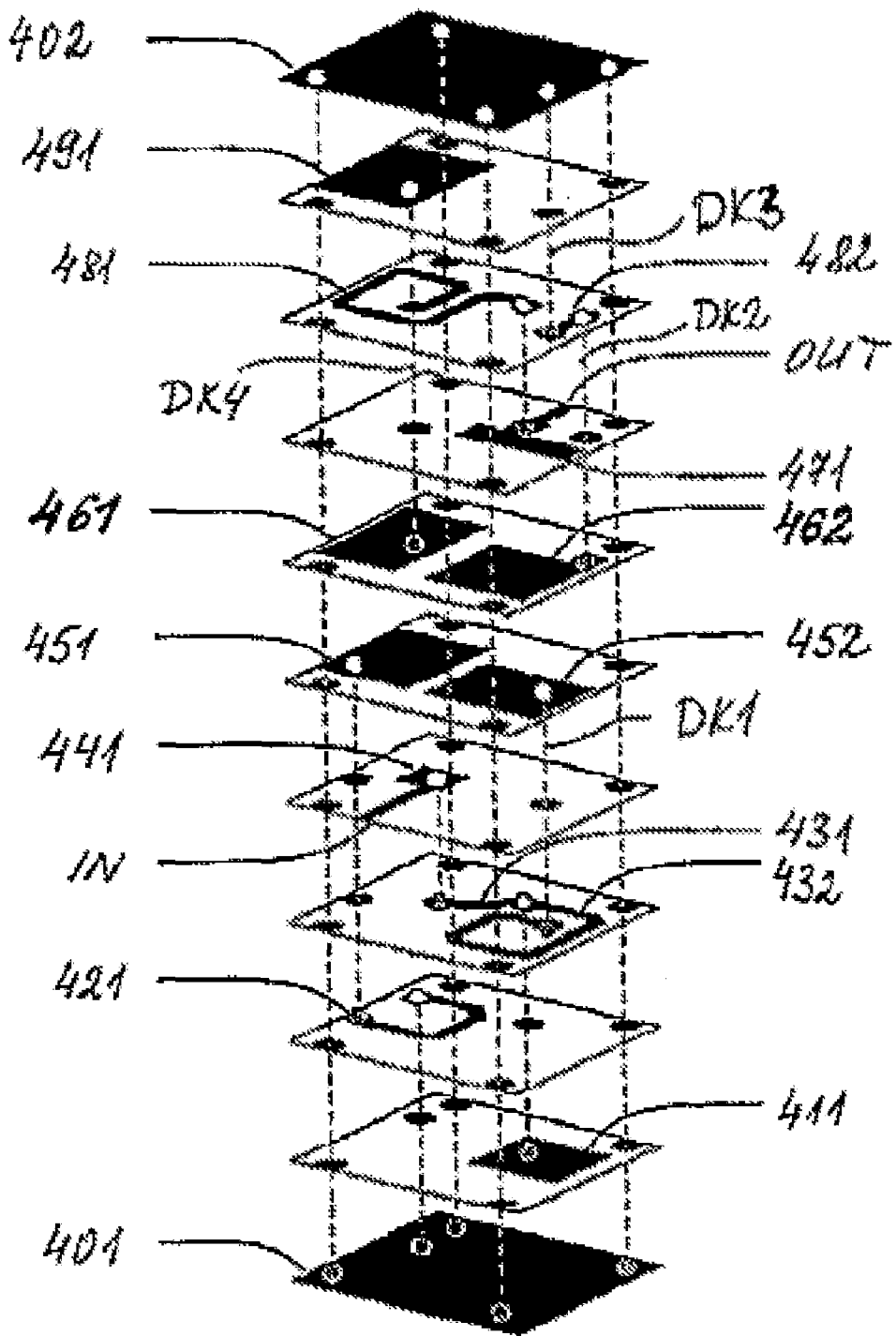
FIG. 4, perspective view of the metallization planes of a substrate with a filter according to FIG. 2 integrated in this substrate.

FIG. 4 shows a component, in which the filter is realized according to FIG. 2. The LC elements arranged in the branches 11, 12 are constructed as conductor paths and conductive areas in the metallization planes of a substrate. The LC elements, especially the inductors, can also be realized, in principle, by means of via contacts, which connect two metallization planes of the substrate.

The capacitor C1 is formed between the conductive areas 441 and 451. The capacitor C3 is formed between the conductive areas 451 and 461. The inductor L2 is formed by the conductor path 421. The inductor L4 is realized by the via contact DK4. The capacitor C5 is formed between the conductive areas 402 and 491. The inductor L6 is realized by the conductor path 481.

The inductor L1 is realized by the conductor path 431, and the inductor L3 is realized by the conductor path 432. The capacitor C2 is formed between the conductive surfaces 401 and 411. The inductor L4 is formed by the via contact DK1, which connects the conductor path 432 and the area 452 conductively. The capacitor C4 is formed between the conductive areas 452 and 462 and the capacitor C6 is formed between the surfaces 462 and 471. The inductor L5 is formed by the conductor path 482 and the via contacts DK2 and DK3.

The conductive areas 401 and 402 arranged in the outer metallization planes are set to ground and are used for shielding the LC elements formed in the inner metallization planes.

Figure 5:
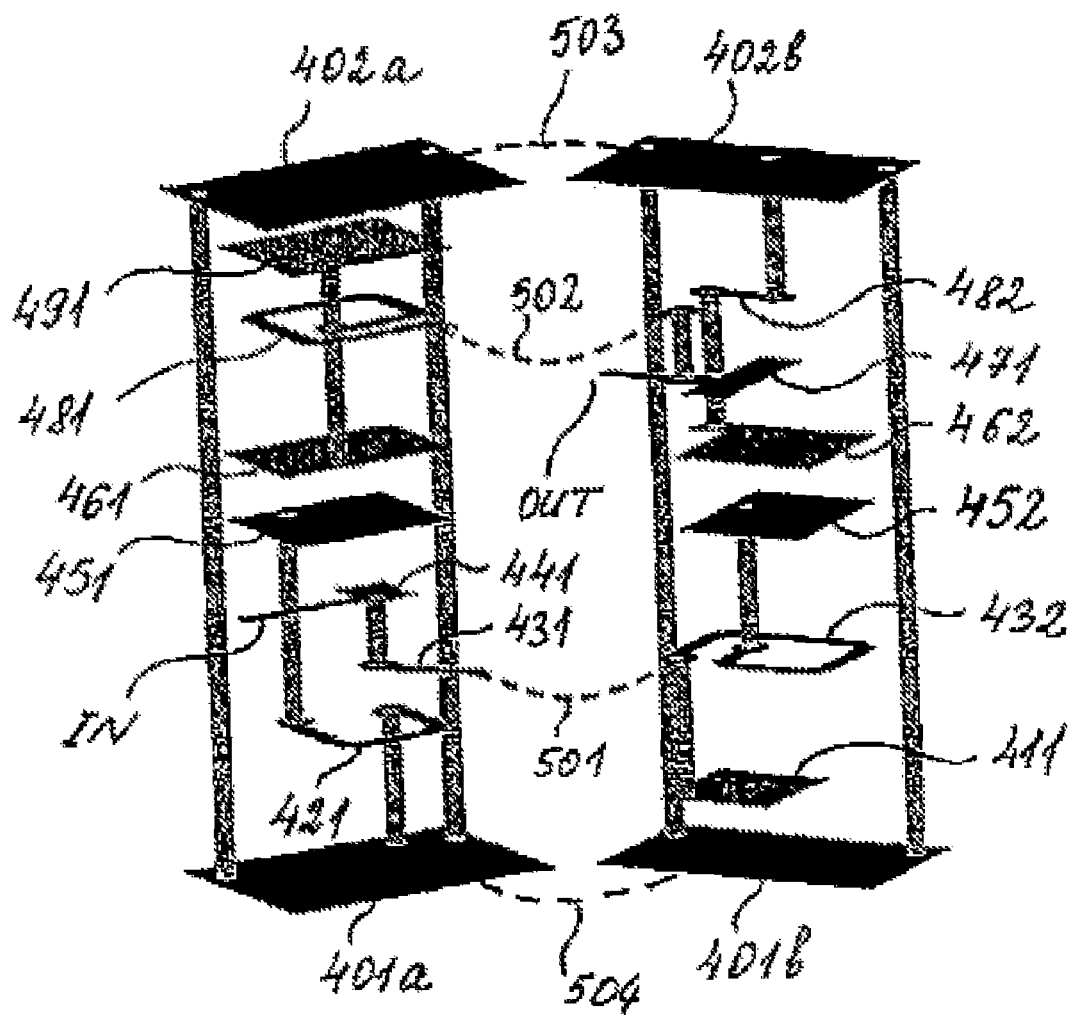
FIG. 5, an embodiment in which the layer configuration according to FIG. 4 is divided into two parts arranged one next to the other.

In FIG. 5, a variant of the realization of the filter presented in FIG. 4 is shown. The layer configuration according to FIG. 4 is divided into two parts, which are arranged preferably one next to the other. 501, 502, and 503 are electrical connections.

The area 401 is here divided into the areas 401a and 401b, which are connected conductively to each other by means of an electrical connection 504 and which are arranged in one metallization plane. The area 402 is divided into the areas 402a and 402b, which are connected conductively to each other by means of an electrical connection 502 and which are arranged in one metallization plane.

| List of reference symbols | |
|---|---|
| 1 | Terminal node of the input-side signal path |
| 2 | Terminal node of the output-side signal path |
| 3-6 | Ports of the measurement device |
| 11 | First signal branch |
| 12 | Second signal branch |
| C1-C6 | Capacitor |
| DK1-DK4 | Via contact |
| in | Input |
| L1-L6 | Inductor |
| M1, M2 | Measurement arrangement |
| out | Output |
| S11, S22 | Reflection coefficient at node 1 |
| S21 | Transfer function of the circuit between the nodes 1 and 2 |
| S31, S41, S51, S61 | Transfer function measured between the node 1 and the nodes 3, 4, 5, and 6, respectively |
| $\phi 31$, $\phi 41$, $\phi 51$, $\phi 61$ | Phase response measured between the node 1 and the nodes 3, 4, 5, and 6, respectively |
| $U_{CW, inc}$ | Incoming wave mode running in the clockwise direction |
| $U_{CW, ref}$ | Reflected wave mode running in the clockwise direction |
| $U_{CCW, inc}$ | Incoming wave mode running in the counterclockwise direction |
| $U_{CCW, ref}$ | Reflected wave mode running in the counterclockwise direction |

The invention claimed is:

1. A bandpass filter comprising:
two parallel signal branches each connected, on an input side, to an input node and, on an output side, to an output node,
the two signal branches forming a ring resonator, having a wave mode with a complex amplitude of $\vec{U}_{CW}=|\vec{U}_{CW}|\exp\{-j\phi_{CW}\}$ propagating in a clockwise direction with a phase $\phi_{CW}$ and a wave mode with a complex amplitude of $\vec{U}_{CCW}=|\vec{U}_{CCW}|\exp\{-j\phi_{CCW}\}$ propagating in a counterclockwise direction with a phase $\phi_{CCW}$,
wherein a vector sum of a resulting wave $\vec{U}_{out}$ at the output node of the bandpass filter at two or more stop frequencies is: $\vec{U}_{out}=\vec{U}_{CW}+\vec{U}_{CCW}=0$, and $|\vec{U}_{CW}|=|\vec{U}_{CCW}|$ and $|\phi_{CW}-\phi_{CCW}|=180°$,
wherein the two or more stop frequencies are arranged such that a passband is formed between two stop frequencies of the two or more stop frequencies.

2. The bandpass filter of claim 1, wherein the ring resonator includes concentrated LC elements.

3. The bandpass filter of claim 1, wherein the signal branches comprise phase shifters.

4. The bandpass filter of claim 1, wherein the signal branches have different amplitude characteristic lines and/or different phase characteristic lines.

5. The bandpass filter of claim 4,
wherein the amplitude and phase characteristic lines of the signal branches are selected, such that the stop frequencies are arranged on both sides of the passband of the bandpass filter and provide steep flanks of the transmission characteristics of the filter.

6. The bandpass filter of claim 1,
wherein the wave mode propagating in the clockwise direction represents the vector sum of all incoming and reflected wave components rotating toward the right, and
the wave mode propagating in the counterclockwise direction represents the vector sum of all incoming and reflected wave components rotating toward the left.

7. The bandpass filter of claim 1,
wherein the signal branches comprise:
a first signal branch including a T-connection comprising two series capacitors and one inductor electrically connected to a ground potential, and
a second signal branch including a T-connection comprising two series inductors and one capacitor electrically connected to the ground potential.

8. The bandpass filter of claim 1, wherein:
a first signal branch of the two signal branches comprises capacitive and inductive components in series between the input node and the output node; and
a second signal branch of the two signal branches comprises capacitive and inductive components in series between the input node and the output node.

9. The bandpass filter of claim 8, wherein the two signal branches comprise the first signal branch and the second signal branch,
the first signal branch comprises the capacitive and inductive components comprising:
a first T-connection including two series capacitors and one parallel inductor, and
a second T-connection connected after the first T-connection including two series inductors and one parallel capacitor, and
the second signal branch comprises the capacitive and inductive components comprising:
a first T-connection including two series inductors and one parallel capacitor, and
a second T-connection connected after the first T-connection including two series capacitors and one parallel inductor.

10. The bandpass filter of claim 1,
wherein a component of a first signal branch of the two signal branches connected to the input node is inductive and a component of a second signal branch of the two signal branches connected to the input node is capacitive.

11. The bandpass filter of claim 1,
wherein a component of a first signal branch of the two signal branches connected to the output node is inductive and a component of a second signal branch of the two signal branches connected to the output node is capacitive.

12. The bandpass filter according to claim 1,
wherein:
the two or more stop frequencies comprises three or more stop frequencies; and
the vector sum of the resulting wave $\vec{U}_{out}$ at the output node at three or more stop frequencies is:

$$\vec{U}_{out}=\vec{U}_{CW}+\vec{U}_{CCW}=0, \text{ and}$$

$$|\vec{U}_{CW}|=|\vec{U}_{CCW}| \text{ and } |\phi_{CW}-\phi_{CCW}|=180°.$$

13. The bandpass filter of claim 1,
the vector sum of the resulting wave $\vec{U}_{out}$ at the output node in a stop frequency range is:

$$\vec{U}_{out}=\vec{U}_{CW}+\vec{U}_{CCW}\approx 0, \text{ and}$$

$$|\vec{U}_{CW}|\approx|\vec{U}_{CCW}| \text{ and } |\phi_{CW}-\phi_{CCW}|\approx 180°.$$

14. The bandpass filter of claim 13,
wherein at two or more frequencies from the stop frequency range: $|\vec{U}_{CW}|=|\vec{U}_{CCW}|$ and $|\phi_{CW}-\phi_{CCW}|=180°$.

15. The bandpass filter of claim 13,
wherein the stop frequency range includes at least one harmonic of a center frequency of the bandpass filter.

16. The bandpass filter of claim 1 further comprising a substrate comprising conductor paths.

17. The bandpass filter of claim 16, wherein the substrate comprises ceramic.

18. The bandpass filter of claim 8, wherein the capacitive and inductive components include a component of the first signal branch connected to the input node that is capacitive and a component of the second signal branch connected to the input node that is inductive.

19. The bandpass filter of claim 8, wherein the capacitive and inductive components include a component of the first signal branch connected to the output node that is capacitive and a component of the second signal branch connected to the output node that is inductive.

20. A bandpass filter comprising:
two parallel signal branches each connected, on an input side, to an input node and, on an output side, to an output node,
the two signal branches forming a ring resonator, having a wave mode with a complex amplitude of $\vec{U}_{CW}=|\vec{U}_{CW}|\exp\{-j\phi_{CW}\}$ propagating in a clockwise direction with a phase $\phi_{CW}$ and a wave mode with a complex amplitude of $\vec{U}_{CCW} = |\vec{U}_{CCW}| \exp\{-j\phi_{CCW}\}$ propagating in a counterclockwise direction with a phase $\phi_{CCW}$, wherein:

a vector sum of a resulting wave $\vec{U}_{out}$ at the output node of the bandpass filter at two or more stop frequencies is:

$\vec{U}_{out} = \vec{U}_{CW} + \vec{U}_{CCW} = 0$, and $|\vec{U}_{CW}| = |\vec{U}_{CCW}|$ and $|\phi_{CW} - \phi_{CCW}| = 180°$, the two of more stop frequencies are arranged such that a passband is formed between two stop frequencies of the two or more stop frequencies;

the wave mode propagating in the clockwise direction represents the vector sum of all incoming and reflected wave components rotating toward the right, and the wave mode propagating in the counterclockwise direction represents the vector sum of all incoming and reflected wave components rotating toward the left.

* * * * *

UNITED STATES PATENT AND TRADEMARK OFFICE
CERTIFICATE OF CORRECTION

PATENT NO. : 7,944,327 B2
APPLICATION NO. : 12/088311
DATED : May 17, 2011
INVENTOR(S) : Roman Kravchenko et al.

Page 1 of 1

It is certified that error appears in the above-identified patent and that said Letters Patent is hereby corrected as shown below:

Column 8, Line 30, Claim 12 – delete " $|\vec{U}_{CW}| = |\vec{U}_{CCW}|$ and $|\phi_{CW} - \phi_{CCW}| = 180°.$ " and insert -- $|\vec{U}_{CW}| = |\vec{U}_{CCW}|$ and $|\phi_{CW} - \phi_{CCW}| = 180°.$ --, therefor.

Column 8, Line 32, Claim 13 – delete "the vector" and insert -- wherein the vector --, therefor.

Signed and Sealed this
Ninth Day of August, 2011

David J. Kappos
*Director of the United States Patent and Trademark Office*